Oct. 31, 1961 J. W. SKERRITT 3,007,059
PULSE AMPLIFIER GATING MEANS CONTROLLED BY COINCIDENT OR SHORTLY PRIOR PULSE
Filed Nov. 26, 1958
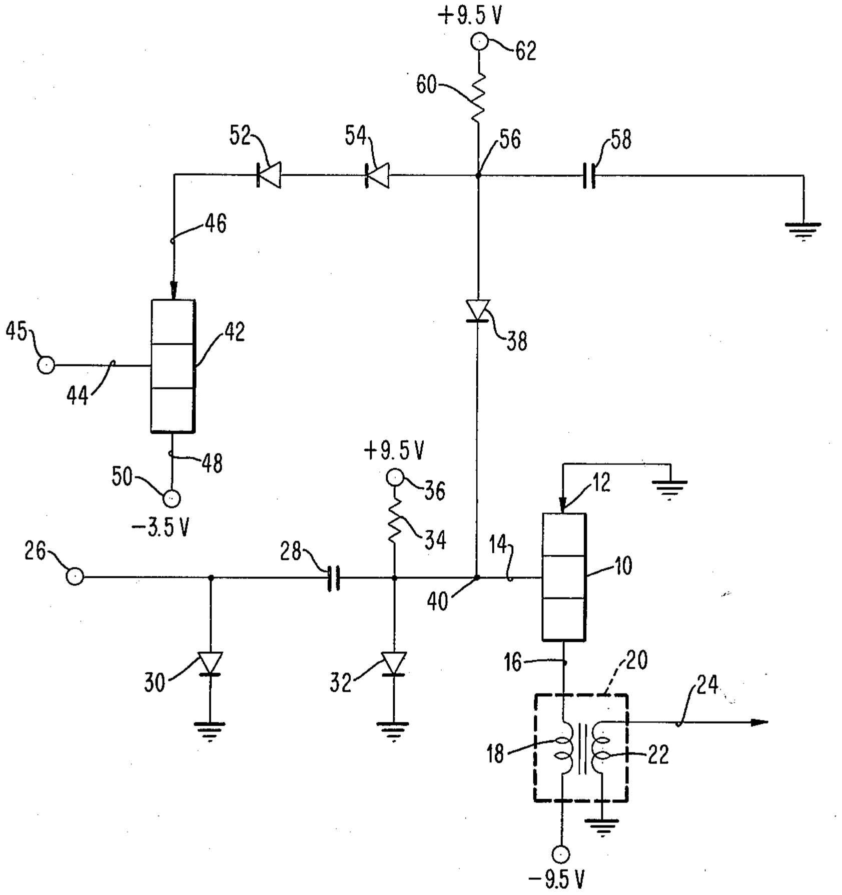
INVENTOR.
JOHN W. SKERRITT
BY Edgar H. Kent
ATTORNEY 3,007,059

PULSE AMPLIFIER GATING MEANS CONTROLLED BY COINCIDENT OR SHORTLY PRIOR PULSE

John W. Skerritt, Kingston, N.Y., assignor to International Business Machines Corporation, New York, N.Y., a corporation of New York Filed Nov. 26, 1958, Ser. No. 776,471
3 Claims. (Cl. 307—88.5)

This invention relates to control circuits of the type especially adapted for use with high speed data processing equipment and more particularly to a pulse gating circuit suitable for the aforementioned purpose.

New designs and the increased variety of applications for digital processing equipment have sharply increased the demand for high speed performance of logical circuit components. Lack of such components which will operate reliably at such high speeds as pulse repetition frequencies in the range of five megacycles per second has handicapped the development, performance and capacities of such equipment. The pulse gating circuit, due to its frequent utilization in this type of circuitry, is one of the more important components. A desirable feature of that component is that it be susceptible to flexible coordination with a variety of logical circuits. The varied loading which occurs in such applications, however, significantly impairs the operational speed of gating circuits heretofore used. In order to achieve the requisite operational speed the circuit should present a high input impedance to control signals. Additionally, the circuit should be designed so that a variety of output loading conditions will not impair the quality of the output pulse.

Accordingly, it is an object of this invention to provide a pulse gating circuit having input and output impedance characteristics which permit high speed operation and accurate pulse translation in a variety of circuit combinations.

Another object of this invention is to provide an improved pulse gating circuit capable of reliable operation at a pulse repetition frequency in excess of five megacycles per second.

Still another object of the invention is to provide a pulse gating and amplifying circuit which is susceptible of ready combination with other components to perform a plurality of the logical functions associated with digital data processing equipment.

Other objects and advantages of the invention will be seen as the following description of the circuitry according to the preferred embodiment of the invention, shown in schematic form in FIG. 1 of the drawing, progresses.

The gating circuit according to the preferred embodiment of the invention combines a pulse amplifying circuit with a gating control circuit which presents a high impedance to incoming control levels. The two circuits are connected through unidirectional current means which is adapted to inhibit the operation of the amplifying circuit in the absence of a proper conditioning signal from the control circuit. This gating circuit has been operated at a pulse repetition frequency in excess of five megacycles per second. The control section of the circuitry is capable of conditioning up to twenty pulse amplifying sections, and as the input to the control section presents a high impedance, this section may be connected up to twenty inputs through a conventional diode OR circuit to provide the logical OR function. The amplifying section is adapted to be associated with a plurality of control level gating inputs to provide the logical AND function. Stringent margin requirements and other design features have been incorporated such that this circuit provides an exceptionally reliable gating circuit. In addition to its high speed and reliability this circuit permits marked economies in construction, as up to twenty gating circuits, each including a transistor, may be controlled by a single control circuit utilizing one transistor.

With reference to the drawing, pulse amplification is provided by a transistor 10 which, in the preferred embodiment, is a PNP junction transistor having an emitter electrode 12, a base electrode 14 and a collector electrode 16. The transistor is connected in grounded emitter configuration such that a negative going input signal applied to the base 14 is adapted to forward bias the emitter base junction, permitting conduction in the transistor output circuit consisting of the emitter and collector. The output signal resulting from conduction of the transistor is applied to the primary winding 18 of a transformer 20. The polarity of the output pulse is inverted by the transformer action and passed from the secondary winding 22 of the transformer over the output line 24.

A source of in-out signals, which in this embodiment are negative going pulses, 3.0 volts in magnitude, is connected to the terminal 26. The input pulses are coupled through the capacitor 28 to the base electrode 14. Diodes 30 and 32, connected between either terminal of the capacitor and ground, act to clamp the capacitor terminals to ground potential. The resistor 34, connected between a source 36 of positive potential 9.5 volts in magnitude and the junction 40 between the capacitor 28 and the base electrode 14, provides $I_{co}$ for the transistor 10 to insure that it remains turned off in the absence of a pulse of proper polarity applied to terminal 26.

Unidirectional current means in the form of a diode 38 is also connected to the junction 40 between the capacitor 28 and the base 14. The diode is poled such that conventional current flow is permitted toward the junction. When a signal of magnitude sufficient to reverse bias the diode 38 is applied to its anode, a pulse applied at terminal 26 will drive the base 14 negative, turning on transistor 10 and producing an output pulse. If, however, the diode 38 is not so reverse biased the base 14 will drop only to about −0.3 volts when the negative going pulse is applied to terminal 26, an insufficient voltage transition for producing an output pulse from transformer 20.

The logical AND function may be provided at this point by the utilization of a plurality of diodes, each having its cathode connected to the junction 40. In order for the transistor 10 to be turned on an application of an input pulse all of the diodes so connected must be sufficiently reverse biased to inhibit current flow through them. Under that circumstance, and only then, the transistor will be turned on sufficiently to produce an output pulse from the transformer 20.

The biasing level for the diode 38 is provided by the control circuitry which includes transistor 42. This transistor is also a PNP junction transistor but is connected in emitter follower configuration, the input signal being applied to the base electrode 44 and the output signal being taken from the emitter electrode 46. The collector electrode 48 is connected to a source 50 of negative potential 3.5 volts in magnitude.

The transistor 42, being connected in emitter follower configuration, presents a high impedance to incoming signals and a plurality of driving circuits may be connected thereto through a conventional diode OR circuit to provide the logical OR function.

Two diodes 52 and 54, connected in series to the emitter 46, are poled to permit conventional current flow into the emitter. The anode of diode 54 is connected at junction 56 to the anode of diode 38. Also connected at junction 56 is one terminal of a capacitor 58 the other terminal of which is grounded, and one terminal of resistance 60 the other terminal of which is connected to a source 62 of positive potential 9.5 volts in magnitude.

When a negative going level of −3.0 volts is applied via terminal 45 to the base 44 of the transistor 42 the emitter base junction becomes forward biased and the resulting current flow in the output circuit of the transistor places a charge on the capacitor 58 of approximately −3.0 volts. As junction 56 is then at that potential the diode 38 is reverse biased and the input to the pulse amplifying transistor 10 is conditioned to gate a pulse applied to the input terminal 26. Upon removal of the conditioning level from the terminal 45 the capacitor 58 is discharged through the resistor 60.

When the capacitor 58 is in discharged condition the diode 38 is not reversed biased and a capacitive voltage divider comprising capacitors 28 and 58 is presented to an input pulse at terminal 26. The values of the capacitors are chosen such that the voltage transition produced at base 14 is sufficient to turn on the transistor enough to produce an output pulse through transformer 20.

This control circuit may be utilized to condition a plurality of pulse amplifying circuits. For example, if the terminal 45 is connected to an output terminal of a bistable multivibrator the resulting level may be used to condition up to 20 pulse amplifying circuits of the type described. Thus a considerable saving in the use of transistors is achieved.

The values for the components utilized in the preferred embodiment are as follows:

| | |
|---|---|
| Resistor 34 | 30,000 ohms. |
| Resistor 60 | 1,000 ohms. |
| Capacitor 28 | 82 $\mu\mu$f. |
| Capacitor 58 | 220 $\mu\mu$f. |
| Diodes (all) | T6G. |
| Transistor 10 | MADT. |
| Transistor 42 | MAT. |
| Transformer 20 | 2.44/1 step down ratio. |

This circuitry has been operated at pulse repetition frequencies substantially in excess of five megacycles per second.

While the preferred embodiment of the invention has been shown and described it will be understood that the invention is not intended to be limited thereto or to details thereof and departures may be made therefrom within the spirit and scope of the following claims.

I claim:

1. A pulse gating circuit including a pulse amplifier circuit comprising a first transistor having an input circuit and an output circuit, means to apply a pulse to said input circuit adapted to turn on said transistor to produce an amplified pulse of current in said output circuit in response to said pulse, and a control circuit responsive to gating pulse signals adapted to apply a conditioning level to said pulse amplifier circuit, said conditioning level being of a duration substantially longer than the duration of said gating pulse signal, comprising a second transistor having emitter, base and collector electrodes, said second transistor being connected in common collector configuration, means to apply a gating pulse signal to said base electrode adapted to turn on said second transistor, a capacitor connected to said emitter electrode adapted to be charged in response to the turn on of said second transistor, a unidirectionally conductive device connected between said capacitor and the input circuit of said pulse amplifier transistor, and means to normally maintain said unidirectionally conductive device in forward biased condition, said capacitor, when charged by said second transistor, producing reverse biased condition of said unidirectionally conductive device such that a pulse applied to said pulse amplified circuit produces a voltage transition at said input circuit suffcient to turn on said first transistor, thereby generating a pulse in is output circuit.

2. A pulse gating circuit including a pulse amplifier circuit comprising a first transistor having emitter, base and collector electrodes, said transistor being connected in common emitter configuration, means to apply a pulse to said base electrode adapted to turn on said transistor to produce an amplified pulse of current at said collector electrode in response to said pulse, a pulse transformer having a primary and a secondary winding, said primary winding being connected to said collector electrode so that said amplified pulse of current flows through said primary winding and induces an output voltage pulse in said secondary winding, and a control circuit responsive to gating pulse signals adapted to apply a conditioning level to said pulse amplifier circuitry, said conditioning level being of a duration substantially longer than the duration of said gating pulse signal, comprising a second transistor having emitter, base and collector electrodes, said second transistor being connected in common collector configuration, means to apply a gating pulse signal to said last named base electrode adapted to turn on said second transistor, a capacitor connected to the emitter electrode of said second transistor adapted to be charged in response to the turn on of said second transistor, a unidirectionally conductive device connected between said capacitor and the base electrode of said first transistor, and means to normally maintain said unidirectionally conductive device in forward biased condition, said capacitor, when charged by said second transistor, producing a reverse biased condition of said unidirectionally conductive device such that a pulse applied to said pulse amplifier circuit produces a voltage transition at its base electrode sufficient to turn on said first transistor, thereby generating an output pulse.

3. A pulse gating circuit including a pulse amplifier circuit comprising a first PNP transistor having emitter, base and collector electrodes, said transistor being connected in common emitter configuration, means to apply a negative pulse to said base electrode adapted to turn on said transistor to produce an amplified pulse of current at said collector electrode in response to said pulse, a pulse transformer having a primary and a secondary winding, said primary winding being connected to said collector electrode so that said amplified pulse of current flows through said primary winding and induces an output voltage pulse in said secondary winding, and a control circuit responsive to negative gating pulse signals adapted to apply a conditioning level to said pulse amplifier circuitry, said conditioning level being of a duration substantially longer than the duration of said gating pulse signal, comprising a second PNP transistor having emitter, base and collector electrodes, said second transistor being connected in common collector configuration, means to apply a gating pulse signal to said last named base electrode adapted to turn on said second transistor, a capacitor connected to the emitter electrode of said second transistor adapted to be charged to a negative potential in response to the turn on of said second transistor, a unidirectionally conductive device connected between said capacitor and the base electrode of said first transistor, and a resistance connected between a source of positive voltage and said unidirectionally conductive device adapted normally to maintain said unidirectionally conductive device in forward biased condition, said capacitor, when charged to a negative potential by said second transistor, producing a reverse biased condition of said unidirectionally conductive device such that said negative pulse, when applied to said pulse amplifier transistor, produces a voltage transition at its base electrode sufficient to turn that transistor on, thereby generating an output pulse.

References Cited in the file of this patent

UNITED STATES PATENTS 2,850,647 Fleisher ---------------- Sept. 2, 1958

2,850,648 Elliott ---------------- Sept. 2, 1958
2,873,388 Trumbo ---------------- Feb. 10, 1959
2,883,650 Brockway ---------------- Apr. 21, 1959

OTHER REFERENCES

Prom et al.: "Junction Transistor Switching Circuits for High Speed Digital Computer Applications," March 1956, published by Sylvania Electric Porducts, 100 First Ave., Waltham, Mass., pages 5–8.

UNITED STATES PATENT OFFICE

CERTIFICATION OF CORRECTION

Patent No. 3,007,059 October 31, 1961

John W. Skerritt

It is hereby certified that error appears in the above numbered patent requiring correction and that the said Letters Patent should read as corrected below.

Column 3, line 32, for "sufficient" read -- insufficient --

Signed and sealed this 24th day of April 1962.

(SEAL)
Attest:

ESTON G. JOHNSON
Attesting Officer

DAVID L. LADD
Commissioner of Patents